(12) United States Patent
Oh et al.

(10) Patent No.: US 11,444,265 B2
(45) Date of Patent: Sep. 13, 2022

(54) FLEXIBLE DISPLAY DEVICE HAVING A MULTI-THICKNESS FUNCTION LAYER

(71) Applicant: SAMSUNG DISPLAY CO., LTD., Yongin-si (KR)

(72) Inventors: Soohee Oh, Yongin-si (KR); Hyunggyu Park, Yongin-si (KR); Seonggeun Won, Yongin-si (KR); Hirotsugu Kishimoto, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 64 days.

(21) Appl. No.: 16/989,804

(22) Filed: Aug. 10, 2020

(65) Prior Publication Data

US 2020/0373517 A1    Nov. 26, 2020

Related U.S. Application Data

(63) Continuation of application No. 16/271,579, filed on Feb. 8, 2019, now Pat. No. 10,741,789, which is a
(Continued)

(30) Foreign Application Priority Data

Mar. 11, 2016  (KR) ........................ 10-2016-0029668

(51) Int. Cl.
*H01L 27/32* (2006.01)
*H01L 51/00* (2006.01)
(Continued)

(52) U.S. Cl.
CPC .......... *H01L 51/5253* (2013.01); *H01L 25/18* (2013.01); *H01L 27/3244* (2013.01);
(Continued)

(58) Field of Classification Search
CPC . H01L 51/5253; H01L 51/0097; H01L 51/52; H01L 51/5212; H01L 51/5228;
(Continued)

(56) References Cited

U.S. PATENT DOCUMENTS 8,823,042 B2 * 9/2014 Kim ....................... H05K 1/028
257/99
8,890,181 B2 * 11/2014 Wang ..................... G07F 17/32
257/88
(Continued)

FOREIGN PATENT DOCUMENTS

KR    10-2006-0023294 A    3/2006
KR    10-2014-0108826        9/2014
(Continued)

*Primary Examiner* — Ida M Soward
(74) *Attorney, Agent, or Firm* — Lewis Roca Rothgerber Christie LLP

(57) ABSTRACT

A flexible display device includes a flexible display panel having a bending area to be folded, and including a display substrate, and a thin-film encapsulation layer above the display substrate, a driving portion, and a function layer below the flexible display panel, and including a step portion below which the flexible display panel is electrically connected to the driving portion.

12 Claims, 7 Drawing Sheets

Related U.S. Application Data continuation of application No. 15/456,336, filed on Mar. 10, 2017, now Pat. No. 10,236,471.

(51) Int. Cl.
  *H01L 51/52* (2006.01)
  *H01L 25/18* (2006.01)
  *G02F 1/133* (2006.01)
  *G02F 1/1333* (2006.01)

(52) U.S. Cl.
  CPC .......... *H01L 51/0097* (2013.01); *H01L 51/52* (2013.01); *H01L 51/529* (2013.01); *H01L 51/5212* (2013.01); *H01L 51/5228* (2013.01); *H01L 51/5284* (2013.01); *G02F 1/133305* (2013.01); *H01L 2251/301* (2013.01); *H01L 2251/5338* (2013.01); *Y02E 10/549* (2013.01)

(58) Field of Classification Search
  CPC ............... H01L 51/5284; H01L 51/529; H01L 2251/5338; H01L 2251/301; H01L 25/18; H01L 27/3244; G02F 1/133305
  See application file for complete search history.

(56) References Cited

U.S. PATENT DOCUMENTS

| | | | | |
|---|---|---|---|---|
| 9,300,289 B2* | 3/2016 | Noguchi | ............ | H03K 17/9622 |
| 9,769,919 B2* | 9/2017 | Park | ........................ | H01L 27/32 |
| 9,933,870 B2* | 4/2018 | You | ........................ | G06F 3/041 |
| 9,991,431 B2* | 6/2018 | Lacey | .................... | H05K 1/189 |
| 10,216,020 B2* | 2/2019 | Lim | .................. | G02F 1/133308 |
| 10,499,493 B2* | 12/2019 | Lee | .................... | G02F 1/13452 |
| 10,679,567 B2* | 6/2020 | Lee | ........................ | H01L 51/5203 |
| 2011/0193478 A1* | 8/2011 | Kim | ........................ | H05K 1/189 |
| | | | | 315/32 |
| 2013/0341597 A1 | 12/2013 | Kim | | |
| 2014/0042406 A1* | 2/2014 | Degner | ............... | H01L 51/0097 |
| | | | | 438/34 |
| 2014/0217382 A1* | 8/2014 | Kwon | .................. | H01L 51/5246 |
| | | | | 257/40 |
| 2014/0306942 A1* | 10/2014 | Ahn | ....................... | G06F 1/1652 |
| | | | | 345/206 |
| 2014/0307396 A1 | 10/2014 | Lee | | |
| 2015/0021570 A1 | 1/2015 | Kim et al. | | |
| 2015/0036300 A1 | 2/2015 | Park et al. | | |
| 2016/0020264 A1* | 1/2016 | Choo | .................. | H01L 27/3272 |
| | | | | 257/40 |
| 2016/0275830 A1 | 9/2016 | You et al. | | |
| 2017/0263873 A1* | 9/2017 | Zhang | .................. | H01L 51/5253 |
| 2018/0092166 A1* | 3/2018 | Kim | ........................ | H05B 33/04 |

FOREIGN PATENT DOCUMENTS

| | | |
|---|---|---|
| KR | 10-2014-0108827 | 9/2014 |
| KR | 10-2014-0122595 | 10/2014 |
| KR | 10-2015-0014713 | 2/2015 |

\* cited by examiner

FLEXIBLE DISPLAY DEVICE HAVING A MULTI-THICKNESS FUNCTION LAYER

CROSS-REFERENCE TO RELATED APPLICATIONS

This application is a continuation of U.S. patent application Ser. No. 16/271,579, filed Feb. 8, 2019, which is a continuation of U.S. patent application Ser. No. 15/456,336, filed Mar. 10, 2017, now U.S. Pat. No. 10,236,471, which claims priority to and the benefit of Korean Patent Application No. 10-2016-0029668, filed Mar. 11, 2016, the entire content of all of which is incorporated herein by reference.

BACKGROUND

1. Field

One or more embodiments relate to a flexible display device.

2. Description of the Related Art

In general, display devices are used in mobile devices, such as smartphones, laptop computers, digital cameras, camcorders, portable information terminals, or tablet personal computers, or are used in electronic devices, such as desktop computers, televisions, outdoor advertising plates, or display devices for exhibitions.

Recently, slim display devices have been commercially available.

Flexible display devices may be more easily moved, and may be applicable to various devices. A representative example of a flexible display device is an organic light-emitting display technology-based flexible display device.

SUMMARY

Embodiments of the present disclosure provide a flexible display device capable of reducing a bezel.

Additional aspects will be set forth in part in the description that follows and, in part, will be apparent from the description, or may be learned by practice of the presented embodiments.

According to one or more embodiments, a flexible display device includes a flexible display panel having a bending area to be folded, and including a display substrate, and a thin-film encapsulation layer above the display substrate, a driving portion, and a function layer below the flexible display panel, and including a step portion below which the flexible display panel is electrically connected to the driving portion.

The function layer may include a first surface facing the flexible display panel, a second surface opposite to the first surface, and a side surface connecting the first surface and the second surface, wherein a thickness of the step portion is less than a thickness of a remainder of the function layer with respect to a direction from the second surface of the function layer to the first surface of the function layer.

A pad terminal on the flexible display panel may be connected to a driving terminal on the driving portion below the step portion.

A portion at which the flexible display panel may be connected to the driving portion might not extend beyond the second surface of the function layer.

The driving portion may include a flexible film, and a driving integrated circuit (IC) located on the flexible film, wherein the driving terminal is located at an edge of the flexible film and corresponds to the pad terminal.

A portion of the flexible display panel may pass by the side surface of the function layer.

The function layer may include an extension portion extending from the side surface of the function layer, and contacting an inner surface of the flexible display panel at the bending area.

A curvature of an edge of the extension portion may correspond to a curvature of the flexible display panel at the bending area.

A filling material may fill a space between the flexible display panel at the bending area and the side surface of the function layer.

The flexible display device may further include a support layer between the flexible display panel and the function layer.

A Young's modulus of the support layer may be 10 MPa or more, and a thickness of the support layer may be about 5 micrometers or less.

The function layer may include a cushion layer between the flexible display panel and the driving portion, and a heat dissipation layer at an outermost surface of the function layer.

The cushion layer may include a polymer as a foam, a gel, or a rubber.

A Young's modulus of the cushion layer may be 10 MPa or less.

The cushion layer may include graphite particles or a black material.

The function layer may include a graphite layer or a black layer on a surface of the cushion layer.

The function layer further may include an embossing layer between the flexible display panel and the cushion layer, and a surface of the embossing layer facing the flexible display panel may define a plurality of air discharge indentations.

The flexible display panel may include a first surface below the thin-film encapsulation layer, and a second surface facing the function layer.

The flexible display panel may be bent away from the thin-film encapsulation layer at the bending area.

A curvature of the flexible display panel at the bending area may correspond to a thickness of the step portion of the function layer.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
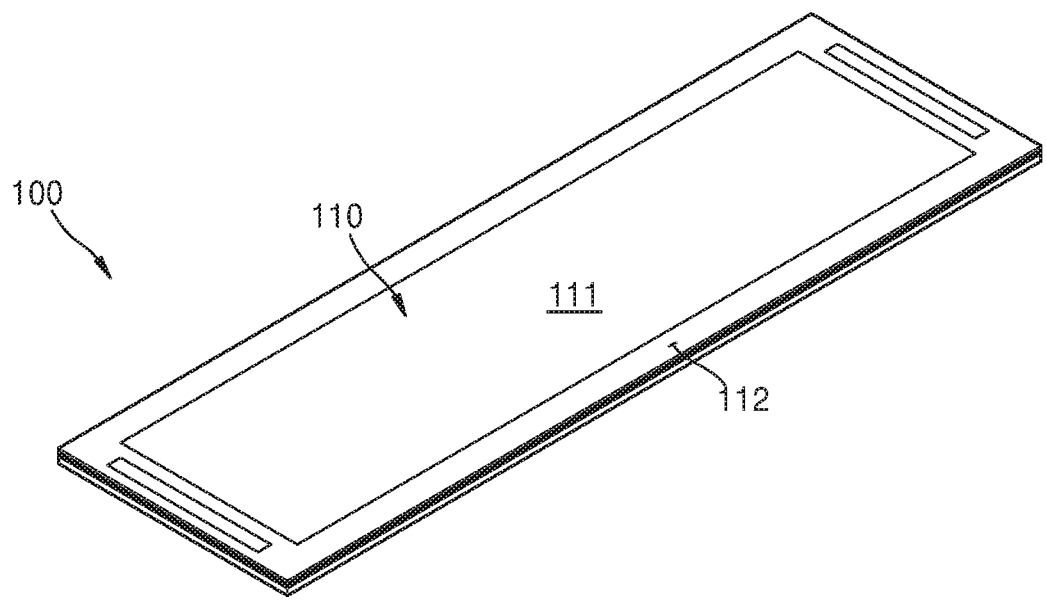
FIG. 1 is a perspective view of a flexible display device according to an embodiment, the flexible display device being unfolded.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
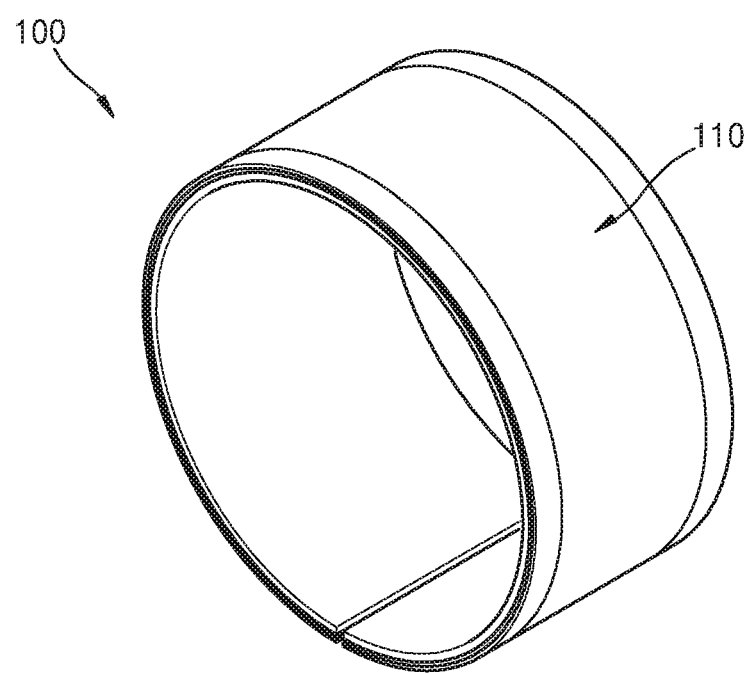
FIG. 2 is a perspective view of the flexible display device FIG. 1, the flexible display device being folded.

FIG. 1 is a perspective view of a flexible display device 100 according to an embodiment, the flexible display device being unfolded, and FIG. 2 is a perspective view of the flexible display device FIG. 1, the flexible display device being folded.

Referring to FIGS. 1 and 2, the flexible display device 100 includes a flexible display panel 110. The flexible display panel 110 includes an active area (AA) 111 for displaying an image, and an inactive area (IA) 112 extending from the AA 111.

The flexible display panel 110 includes a flexible display substrate, and also includes various films, such as a touch screen, a planarizing plate, a cover window, etc.

An image displayed on the flexible display device 100 may be viewed while the flexible display device 100 is in various forms, for example, while flexible display device 100 is spread out, curved, or rolled to be in a cylindrical form.

Figure 3:
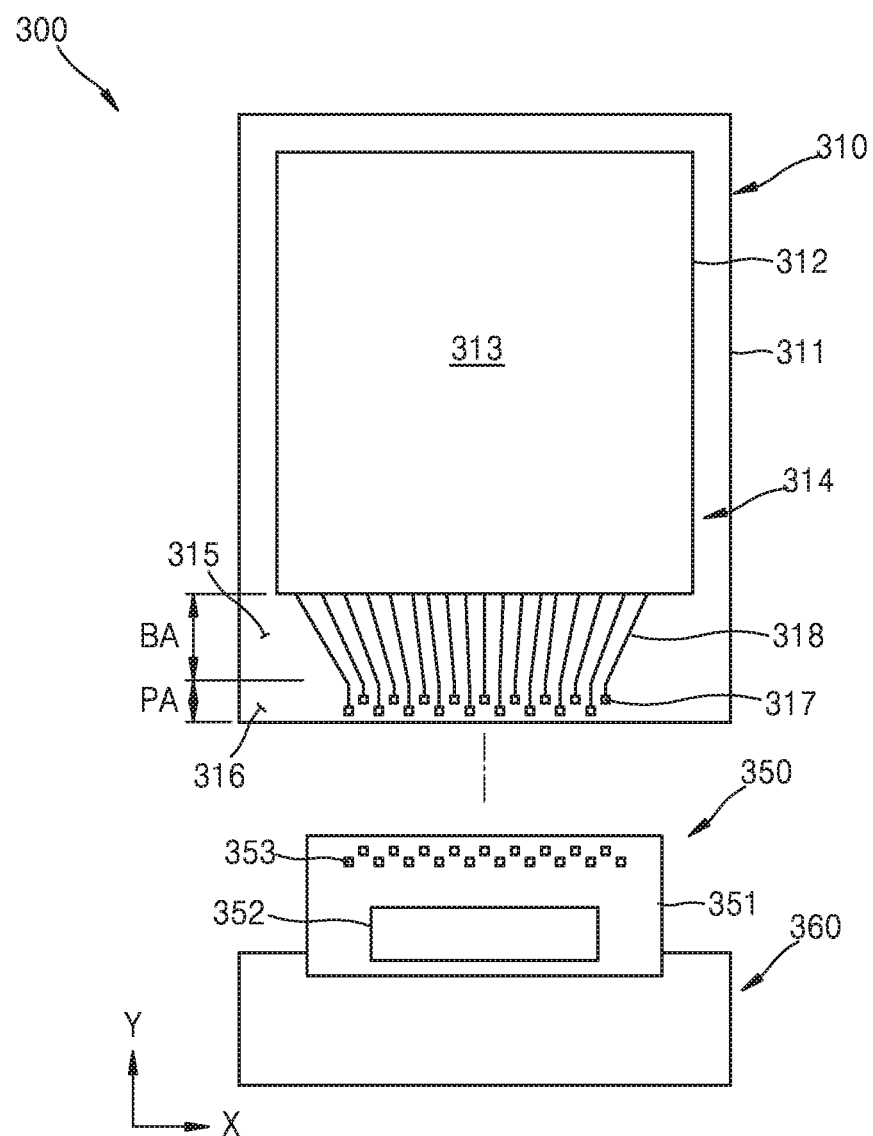
FIG. 3 is an exploded plan view of a flexible display device according to an embodiment.
Figure 4:
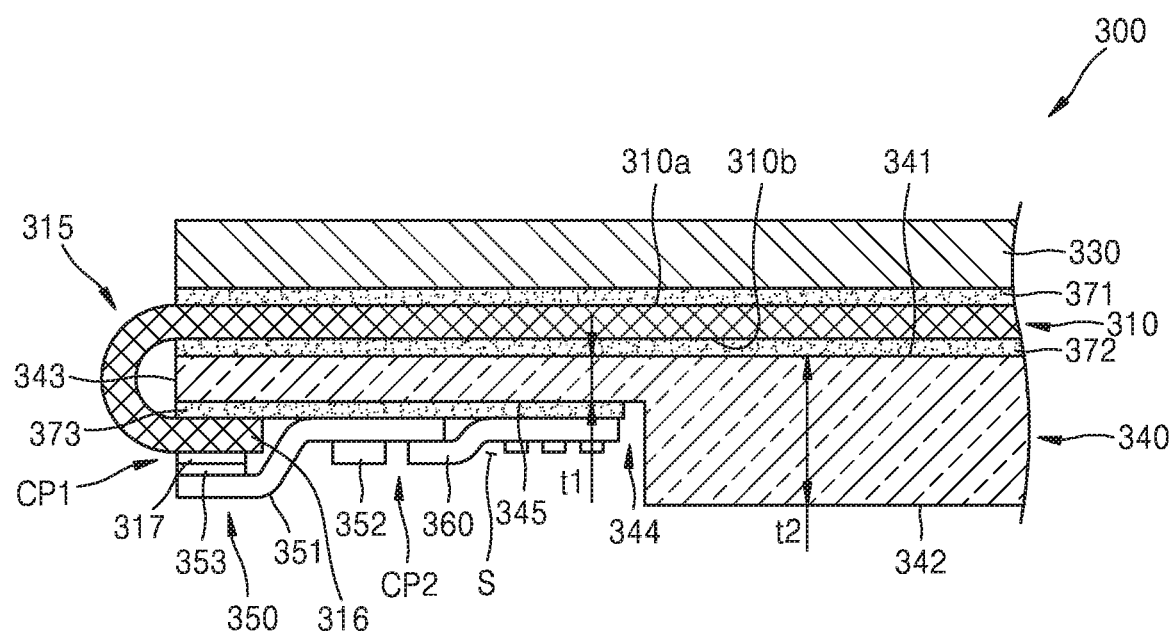
FIG. 4 is a cross-sectional view of the flexible display device of FIG. 3 being assembled.

FIG. 3 is an exploded plan view of a flexible display device 300 according to an embodiment, and FIG. 4 is a view of the flexible display device 300 of FIG. 3 being assembled.

Referring to FIGS. 3 and 4, the flexible display device 300 includes a flexible display panel 310, a driver (e.g., a driving unit) 350 electrically connected to the flexible display panel 310, and a function layer 340 located below the flexible display panel 310.

In the present embodiment, an organic light-emitting display device is used as the flexible display device 300. In other embodiments, the flexible display device 300 may be a liquid crystal display (LCD), a field emission display (FED), an electronic paper display (EPD), or the like.

The flexible display panel 310 includes a display substrate 311 including a plurality of devices, and a thin film encapsulation (TFE) layer 312 located on the display substrate 311.

The flexible display panel 310 includes a first surface 310a, and a second surface 310b that is opposite to the first surface 310a. The second surface 310b may face the function layer 340. The TFE layer 312 may be located on the first surface 310a of the flexible display panel 310.

A planarizing plate 330 may be located above the flexible display panel 310. In one or more embodiments, a touch screen or a cover window may be further located on the flexible display panel 310. An adhesion layer 371 may be located between the flexible display panel 310 and the planarizing plate 330.

The flexible display panel 310 includes an AA 313 for displaying an image, and an IA 314 extending from the AA 313.

The IA 314 surrounds the AA 313. The IA 314 includes a bending area (BA) 315 allowing the flexible display panel 310 to be folded. In one embodiment, the flexible display panel 310 includes a pad area (PA) 316 extending from the BA 315.

At least one thin film transistor (TFT) and at least one light-emitting device connected thereto may be located on the display substrate 311. The display substrate 311 may include a polymer, such as polyimide (PI).

The TFE layer 312 may be located above the display substrate 311. The AA 313 may be covered by the TFE layer 312.

The BA 315 may be folded away from, or in a direction opposite to, the first surface 310a of the flexible display panel 310 with the TFE layer 312 thereabove.

The PA 316 may be located at an edge of the flexible display panel 310. A plurality of pad terminals 317 may be located at the PA 316. The pad terminals 317 may be connected to wirings 318 extending from the AA 313.

The driving portion 350 includes a driving circuit, and may be a chip-on-film (COF). The driving portion 350 includes a flexible film 351, a driving integrated circuit (IC) 352 located on the flexible film 351, and a plurality of driving terminals 353 located at an edge of the flexible film 351.

In one embodiment, the driving portion 350 may be a chip-on-plastic (COP) or a chip-on-glass (COG), but is not limited thereto, as long as one or more terminals are located on a flexible film.

The pad terminals 317 may be connected to (e.g., connected to respective ones of) the driving terminals 353. The driving terminals 353 may be positioned such that the driving terminals 353 correspond to (e.g., correspond to respective ones of) the pad terminals 317.

The driving portion 350 may be electrically connected to a circuit board 360. The circuit board 360 may be a flexible printed circuit board (FPCB).

The function layer 340 may be located below the second surface 310b of the flexible display panel 310. The function layer 340 includes a first surface 341 facing the flexible display panel 310, a second surface 342 that is opposite to the first surface 341, and a side surface 343 connecting the first surface 341 and the second surface 342 (e.g., connecting the first surface 341 and another surface 345 to be described below). An adhesion layer 372 may be located between the flexible display panel 310 and the function layer 340.

The function layer 340 includes a step portion 344 below which a portion CP1, at which the flexible display panel 310 is connected to the driving portion 350, is located. The step portion 344 may be formed such that the thickness of a portion of the function layer 340 is smaller than the thickness of a remainder of the function layer 340, the thicknesses being measured in a direction from the second surface 342 of the function layer 340 to the first surface 341 of the function layer 340. That is, a thickness t1 of the step portion 344 may be smaller than a thickness t2 between the first surface 341 and the second surface 342 of the function layer 340.

In the portion CP1 located below the step portion 344, the pad terminal(s) 317 located on the PA 316 of the flexible display panel 310 may be connected to the driving terminal(s) 353 located on the driving portion 350.

The portion CP1, at which the flexible display panel 310 is connected to the driving portion 350, might not extend beyond the second surface 342 of the function layer 340. In one embodiment, a space S exists below the step portion 344. The portion CP1, at which the flexible display panel 310 is connected to the driving portion 350, and a portion CP2, at which the driving portion 350 is connected to the circuit board 360, exist within the space S. The portions CP1 and CP2 do not extend beyond the second surface 342 of the function layer 340.

The step portion 344 may include a surface 345 below which an adhesion layer 373 is located. The PA 316 of the flexible display panel 310, the driving portion 350, and the circuit board 360 may be attached below the adhesion layer 373.

In one embodiment, the adhesion layer 373 may be located alone between the surface 345 of the step portion 344 and the PA 316, between the surface 345 of the step portion 344 and the driving portion 350, and between the surface 345 of the step portion 344 and the circuit board 360. That is, other elements, such as a polymer film having a supporting capability, might not exist between the surface 345 of the step portion 344 and the PA 316, between the surface 345 of the step portion 344 and the driving portion 350, or between the surface 345 of the step portion 344 and the circuit board 360. In one embodiment, the adhesion layer 373 may have a varying thickness.

The flexible display panel 310 may extend below the step portion 344 while passing by the side surface 343 of the function layer 340. For example, the BA 315 allowing the flexible display panel 310 to be folded in one direction may be located at the side surface 343 of the function layer 340. The PA 316 of the flexible display panel 310 extending from the BA 315 to an edge of the flexible display panel 310 may be located below the step portion 344.

A curvature of the BA 315 of the flexible display panel 310 may correspond to the thickness t1 of the step portion 344 of the function layer 340. The curvature of the flexible display panel 310 may vary depending on the thickness t1 of the step portion 344 of the function layer 340. In one embodiment, a radius of the curvature of the BA 315 may be in a range of about 0.05 millimeters to about 0.3 millimeters, and a size of bezel may be about 0.3 millimeters or less.

In one embodiment, a support layer may be located between the flexible display panel 310 and the function layer 340.

Figure 5:
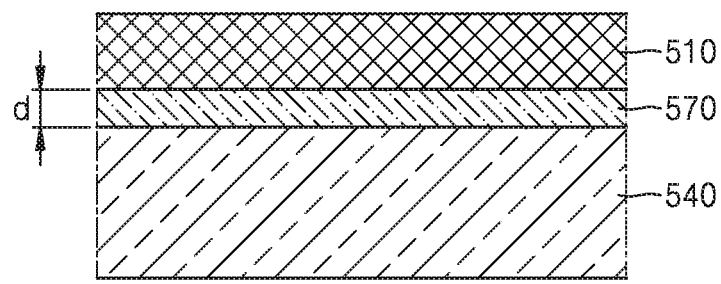
FIG. 5 is a cross-sectional view of an example of the flexible display device of FIG. 4.

For example, referring to FIG. 5, a support layer 570 may be located between a flexible display panel 510 and a function layer 540. The support layer 570, which may fill a distance d between the flexible display panel 510 and the function layer 540, may have a Young's modulus of about 10 MPa or more. The thickness of the support layer 570 may be about 5 micrometers or less. In other embodiments, the support layer 570 may include a material having a Young's modulus of about 10 MPa or less. In other embodiments, the support layer 570 might not include a material that has a Young's modulus of more than about 10 MPa, and might not have a thickness of more than about 5 micrometers.

In one or more embodiments, the support layer 570 may be located below areas of a flexible display device other than the area as described above. For example, a support layer having a Young's modulus of about 10 MPa and a thickness of about 5 micrometers or less may be located below the step portion 344 of the function layer 340 illustrated in FIG. 4. In one embodiment, a support layer including a material that has a Young's modulus of more than about 10 MPa and a thickness of more than about 5 micrometers might not be located below the step portion 344. In one or more embodiments, the support layer may include a material having a Young's modulus of about 10 MPa or less.

The function layer 340 may have a structure including a plurality of films stacked.

Figure 6:
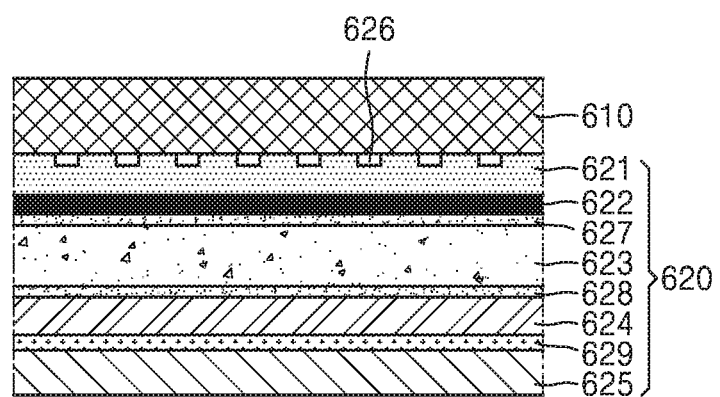
FIG. 6 is a cross-sectional view illustrating a portion of a function layer according to an embodiment.

For example, referring to FIG. 6, a function layer 620 may be located under a flexible display panel 610.

The function layer 620 of the present embodiment includes a cushion layer 623 located between the flexible display panel 610 and the driving portion 350 (refer to FIG. 4). The cushion layer 623 may reduce an impact that may otherwise be applied to the flexible display panel 610. The cushion layer 623 may include a polymer, such as polypropylene (PP) or polyethylene (PE).

In one embodiment, the cushion layer 623 may include any material that has a density of about 0.5 $g/cm^3$ or more. The cushion layer 623 may be formed as a foam or gel. In one or more embodiments, the cushion layer 623 may include a material having high elastic force, for example, rubber.

An embossing layer 621 may be located between the flexible display panel 610 and the cushion layer 623. The embossing layer 621 may have an adhesive capability. The embossing layer 621 may include, or define, a plurality of air discharge holes, or indentations, 626 on a surface thereof facing the flexible display panel 610.

A black layer 622 may be located between the embossing layer 621 and the cushion layer 623 to prevent exposure of constituting parts, such as the driving portion 350 (refer to FIG. 4) and the circuit board 360 (refer to FIG. 4). The black layer 622 may include a black insulating material. An adhesion layer 627 may be located between the black layer 622 and the cushion layer 623.

A graphite layer 624 may be located under the cushion layer 623. The graphite layer 624 may dissipate heat. An adhesion layer 628 may be located between the cushion layer 623 and the graphite layer 624.

A heat dissipation layer 625 may constitute the outermost layer of the function layer 620. The heat dissipation layer 625 may include a metal layer including, for example, copper. The heat dissipation layer 625 may emit heat that has been generated by the flexible display panel 610 toward the outside. An adhesion layer 629 may be located between the graphite layer 624 and the heat dissipation layer 625.

In one embodiment, any one of the layers that constitute the function layer 620 may have a composite functionality.

Figure 7:
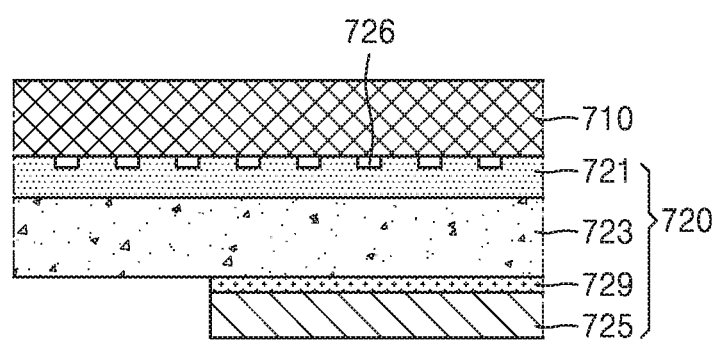
FIG. 7 is a cross-sectional view illustrating a portion of a function layer according to an embodiment.

In one embodiment, referring to FIG. 7, a function layer 720 may be located under a flexible display panel 710.

The function layer 720 of the present embodiment includes a cushion layer 723 located between the flexible display panel 710 and the driving portion 350 (refer to FIG. 4). A cushion layer 723 may have a composite functionality. The cushion layer 723 may include a polymer in the form of a foam or a gel to reduce impact otherwise applied to the flexible display panel 710. The density of the foam or gel may be about 0.5 $g/cm^3$ or more. In one or more embodiments, the cushion layer 723 may include rubber. The cushion layer 723 may include a material having a Young's modulus of about 10 MPa or less. In one embodiment, the cushion layer 723 may be prepared by mixing graphite particles. In one embodiment, the cushion layer 723 may include a black material.

An embossing layer 721 may be located between the flexible display panel 710 and the cushion layer 723. A plurality of air discharge holes, or indentations, 726 may be at a surface of the embossing layer 721 that faces the flexible display panel 710.

A heat dissipation layer 725 may constitute the outermost layer of the function layer 720. The heat dissipation layer 725 may include a metal layer including, for example, copper. An adhesion layer 729 may be located between the cushion layer 723 and the heat dissipation layer 725.

The function layer 620 illustrated in FIG. 6 and the function layer 720 illustrated in FIG. 7 may further include layers for performing other functions. Such layers may include a protection layer for reinforcing strength of a function layer, an antenna layer, or the like. In one or more embodiments, the thickness of the function layer 620 illustrated in FIG. 6 and the thickness of the function layer 720 illustrated in FIG. 7 may each be appropriately designed depending on a corresponding function.

Figure 8:
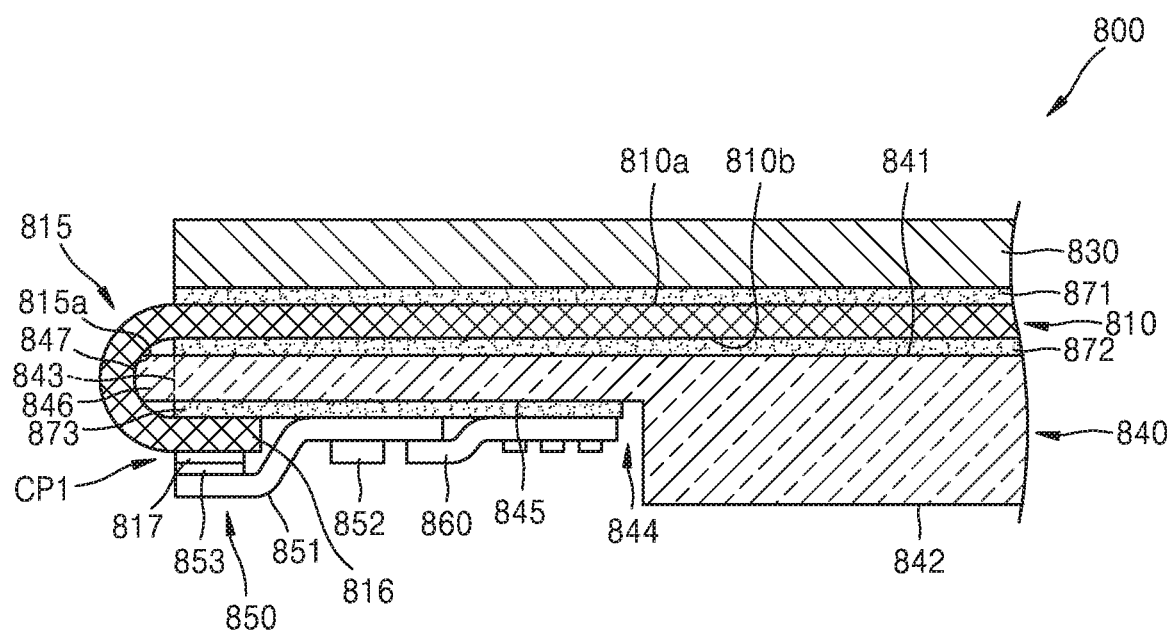
FIG. 8 is a cross-sectional view of an assembled flexible display device according to an embodiment.

FIG. 8 is a cross-sectional view of a flexible display device 800 according to an embodiment, the flexible display device 800 being assembled.

Referring to FIG. 8, the flexible display device 800 includes a flexible display panel 810, a driving portion 850 that is electrically connected to the flexible display panel 810, and a function layer 840 located below the flexible display panel 810.

The flexible display panel 810 includes a first surface 810a, and a second surface 810b that is opposite to the first surface 810a. The second surface 810b may face the function layer 840.

A planarizing plate 830 may be located above the flexible display panel 810. An adhesion layer 871 may be located between the flexible display panel 810 and the planarizing plate 830.

The flexible display panel 810 includes a BA 815 to allow the flexible display panel 810 to bend. In one embodiment, the flexible display panel 810 includes a PA 816 extending from the BA 815. The PA 816 may be located at an edge of the flexible display panel 810. A plurality of pad terminals 817 may be located on the PA 816.

The driving portion 850 includes a flexible film 851, a driving IC 852 located on the flexible film 851, and a plurality of driving terminals 853 located at the edge of the flexible film 851.

The pad terminals 817 may be respectively connected to the driving terminals 853. The driving terminals 853 may be located in such positions that the driving terminals 853 respectively correspond to the pad terminals 817.

The driving portion 850 may be electrically connected to a circuit board 860.

The function layer 840 may be located below the second surface 810b of the flexible display panel 810. The function layer 840 includes a first surface 841 facing the flexible display panel 810, a second surface 842 that is opposite to the first surface 841, and a side surface 843 connecting the first surface 841 and the second surface 842 (e.g., connecting the first surface 841 and another surface 845 to be described below). An adhesion layer 872 may be located between the flexible display panel 810 and the function layer 840.

The function layer 840 includes a step portion 844. The step portion 844 may be formed by reducing the thickness of a portion of the function layer 840 to be less than the thickness of a remainder of the function layer 840 that is in a direction from the second surface 842 of the function layer 840 to the first surface 841 of the function layer 840.

A portion CP1 in which the pad terminals 817 of the flexible display panel 810 are connected to the driving terminals 853 of the driving portion 850 may be located below the step portion 844. In one embodiment, in the portion CP1, the pad terminals 817 of the flexible display panel 810 are connected to the driving terminals 853 of the driving portion 850, and the portion CP1 does not extend beyond the second surface 842 of the function layer 840.

An adhesion layer 873 may be located below a surface 845 of the step portion 844. The PA 816 of the flexible display panel 810, the driving portion 850, and the circuit board 860 may be fixed below the adhesion layer 873.

The flexible display panel 810 may extend below the step portion 844, passing by the side surface 843 of the function layer 840. The BA 815, which allows the flexible display panel 810 to bend in one direction, may be located on the side surface 843 of the function layer 840.

The function layer 840 may support the BA 815. An extension portion 846 may extend from the side surface 843 of the function layer 840. The extension portion 846 may extend from, and may be integrated with, the side surface 843 of the function layer 840. The extension portion 846 may have an edge 847 that directly contacts an inner surface 815a of the BA 815. A curvature of an edge 847 of the extension portion 846 may be the same as a curvature of the BA 815.

As described above, the BA 815 may be supported by adjusting the length of the function layer 840.

Figure 9:
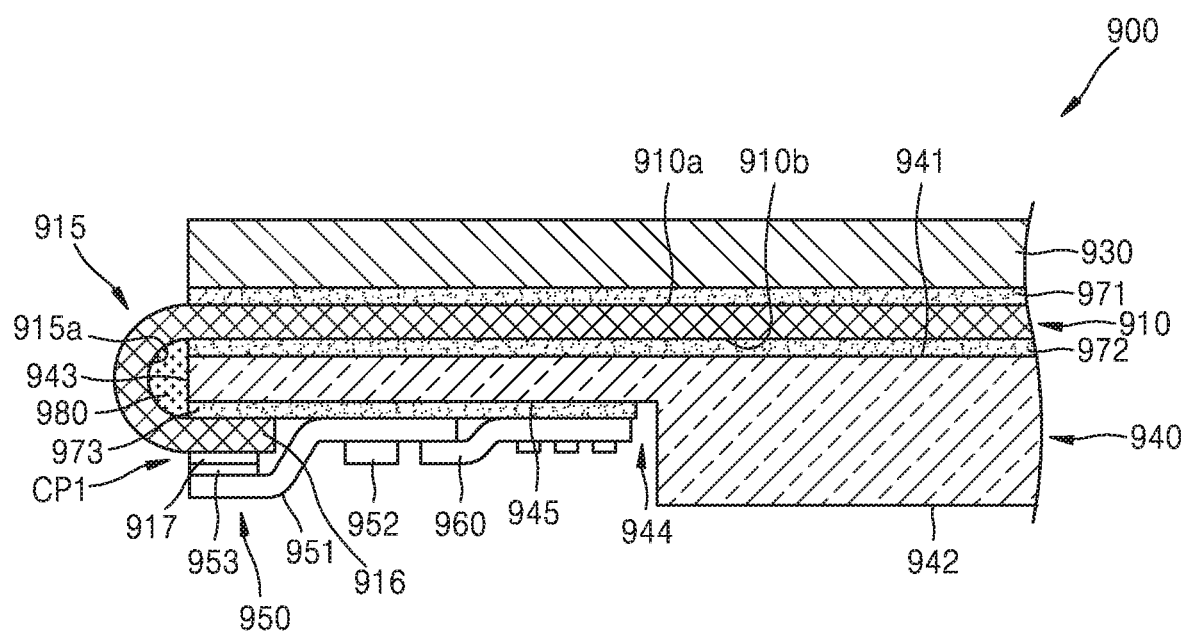
FIG. 9 is a cross-sectional view of an assembled flexible display device according to an embodiment.

FIG. 9 is a cross-sectional view of a flexible display device 900 according to an embodiment, the flexible display device 900 being assembled.

Referring to FIG. 9, the flexible display device 900 includes a flexible display panel 910, a driving portion 950 electrically connected to the flexible display panel 910, and a function layer 940 located below the flexible display panel 910.

The flexible display panel 910 includes a first surface 910a, and a second surface 910b that is opposite to the first surface 910a. The second surface 910b may face the function layer 940.

A planarizing plate 930 may be located above the flexible display panel 910. An adhesion layer 971 may be located between the flexible display panel 910 and the planarizing plate 930.

The flexible display panel 910 may have a BA 915 that allows the flexible display panel 910 to bend. In one embodiment, the flexible display panel 910 has a PA 916 extending from the BA 915. The PA 916 may be located on an edge of the flexible display panel 910. A plurality of pad terminals 917 may be located on the PA 916.

The driving portion 950 includes a flexible film 951, a driving IC 952 located on the flexible film 951, and a plurality of driving terminals 953 located at an edge of the flexible film 951.

The pad terminals 917 may be connected to the driving terminals 953. The driving terminals 953 may be located in such positions that the driving terminals 953 correspond to the pad terminals 917.

The driving portion 950 may be electrically connected to a circuit board 960.

The function layer 940 may be located below the second surface 910b of the flexible display panel 910. The function layer 940 has a first surface 941 facing the flexible display panel 910, a second surface 942 that is opposite to the first surface 941, and a side surface 943 connecting the first surface 941 and the second surface 942 (e.g., connecting the first surface 941 and another surface 945 to be described below). An adhesion layer 972 may be located between the flexible display panel 910 and the function layer 940.

The function layer 940 includes a step portion 944. The step portion 944 may be formed by reducing the thickness of a portion of the function layer 940 in a direction from the second surface 942 of the function layer 940 to the first surface 941 of the function layer 940, such that the thickness of the thinned portion of the function layer 940 is less than that of the remainder of the function layer 940. The portion CP1 in which the pad terminals 917 of the flexible display panel 910 are connected to the driving terminals 953 of the driving portion 950 may be located below the step portion 944.

An adhesion layer 973 may be located below a surface 945 of the step portion 944. The PA 916 of the flexible display panel 910, the driving portion 950, and circuit board 960 may be fixed below the adhesion layer 973.

The flexible display panel 910 may extend below the step portion 944 while passing by the side surface 943 of the function layer 940. The BA 915 of the flexible display panel 910 to be folded in one direction may be located on the side surface 943 of the function layer 940.

There may be a space between the BA 915 of the flexible display panel 910 and the side surface 943 of the function layer 940. A filling material 980 may fill the space defined by an inner surface 915*a* of the BA 915 of the flexible display panel 910 and the side surface 943 of the function layer 940. The filling material 980 may be resin. Because the filling material 980 fills the space between the BA 915 and the function layer 940, the BA 915 of the flexible display panel 910 may be fixed.

Figure 10:
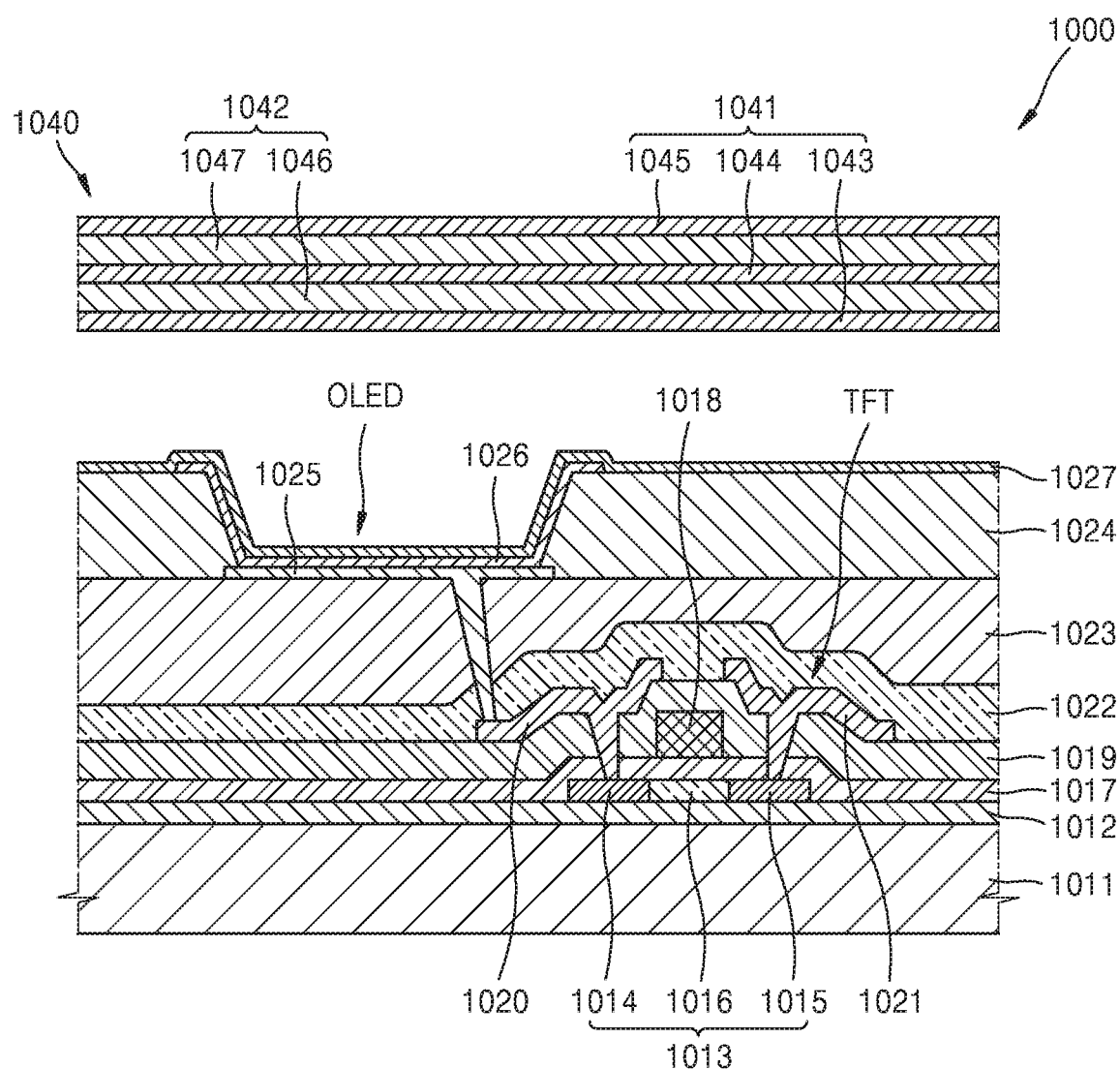
FIG. 10 is a cross-sectional view of a sub-pixel of an organic light-emitting display device according to an embodiment.

FIG. 10 is a cross-sectional view of a sub-pixel of an organic light-emitting display device 1000 according to an embodiment.

Referring to FIG. 10, the organic light-emitting display panel 1000 includes a display substrate 1011, and a thin-film encapsulation layer 1040 located above the display substrate 1011.

In one embodiment, one sub-pixel may include at least one thin film transistor TFT and an organic light-emitting device OLED. A thin film transistor is not limited to the thin film transistor TFT illustrated in FIG. 10, and the number and structure of thin film transistors may vary.

The display substrate 1011 may be a flexible glass substrate or a flexible polymer substrate. The display substrate 1011 may be transparent, semi-transparent, or non-transparent.

A buffer film 1012 may be located on the display substrate 1011. The buffer film 1012 may completely cover the surface of the display substrate 1011. The buffer film 1012 may include an inorganic material or an organic material. The buffer film 1012 may be a single film or a multi-layered film.

A thin film transistor TFT may be located on the buffer film 1012. In the present embodiment, the thin film transistor TFT may be a top gate transistor. However, in one or more embodiments, the thin film transistor TFT may be a bottom gate transistor.

A semiconductor active material layer 1013 may be located on the buffer film 1012. The semiconductor active material layer 1013 may include a source area 1014 and a drain area 1015, which are formed by doping with an N-type impurity ion or a P-type impurity ion. A channel area 1016 that is not doped with an impurity may be located between the source area 1014 and the drain area 1015. The semiconductor active material layer 1013 may include an organic semiconductor, an inorganic semiconductor, or amorphous silicon. In one embodiment, the semiconductor active material layer 1013 may include an oxide semiconductor.

A gate insulating film 1017 may be deposited on the semiconductor active material layer 1013. The gate insulating film 1017 may be an inorganic film. The gate insulating film 1017 may be a single film or a multi-layered film.

A gate electrode 1018 may be located on the gate insulating film 1017. The gate electrode 1018 may include a metallic material having excellent conductivity. The gate electrode 1018 may be a single film or a multi-layered film.

An interlayer insulating film 1019 may be located on the gate electrode 1018. The interlayer insulating film 1019 may be an inorganic film or an organic film.

A source electrode 1020 and a drain electrode 1021 may be located on the interlayer insulating film 1019. In one embodiment, a portion(s) of the gate insulating film 1017 and a portion(s) of the interlayer insulating film 1019 are removed to form contact holes, through which the source electrode 1020 is electrically connected to the source area 1014, and through which the drain electrode 1021 is electrically connected to the drain area 1015.

A passivation film 1022 may be located on the source electrode 1020 and the drain electrode 1021. The passivation film 1022 may be an inorganic film or an organic film. A planarization film 1023 may be located on the passivation film 1022. The passivation film 1022 or the planarization film 1023 may not be used herein.

The thin film transistor TFT may be electrically connected to the organic light emitting display device OLED.

The organic light-emitting device OLED may be located on the planarization film 1023. The organic light-emitting device OLED includes a first electrode 1025, an intermediate layer 1026, and a second electrode 1027.

The first electrode 1025 may act as an anode, and may include various conductive materials. The first electrode 1025 may include a transparent electrode or a reflective electrode.

A pixel-defining layer 1024 may be located on the planarization film 1023. The pixel-defining layer 1024 may cover a portion(s) of the first electrode 1025. The pixel-defining layer 1024 defines an emission area of a sub-pixel by surrounding an edge of the first electrode 1025. The first electrode 1025 may be patterned corresponding to a sub-pixel. The pixel-defining layer 1024 may include an organic film or an inorganic film. The pixel-defining layer 1024 may be a single film or a multi-layered film.

The intermediate layer 1026 may be located on a portion of the first electrode 1025 that is exposed by etching a portion of the pixel-defining layer 1024. The intermediate layer 1026 may be formed by using a deposition process. The intermediate layer 1026 may include an organic emission layer.

In one or more embodiments, the intermediate layer 1026 may include an organic emissive layer, and at least one layer of a hole injection layer (HIL), a hole transport layer (HTL), an electron transport layer (ETL), or an electron injection layer (EIL). The present embodiment, however, is not limited thereto. In one or more embodiments, the intermediate layer 1026 may include, in addition to the organic emission layer, various other function layers.

The second electrode 1027 may be located on the intermediate layer 1026. The second electrode 1027 may act as a cathode. The second electrode 1027 may include a transparent electrode or a reflective electrode.

In one embodiment, a plurality of sub-pixels may be located on the display substrate 1011. For example, each of the sub-pixels may embody red, green, blue, or white color. However, embodiments of the present disclosure are not limited thereto.

The thin-film encapsulation layer 1040 may cover the organic light-emitting device OLED. The thin-film encapsulation layer 1040 may include an inorganic film 1041 and an organic film 1042, which are alternately stacked. For example, the inorganic film 1041 may include a first inorganic film 1043, a second inorganic film 1044, and a third inorganic film 1045, while the organic film 1042 may include a first organic film 1046 and a second organic film 1047.

A flexible display device according to an embodiment may have a bezel that is reduced due to a decrease in the curvature of a bending area of a flexible display panel. Effects of the present disclosure may further include, in addition to the above-described effects, other effects that are obtainable in explaining embodiments of the present disclosure in connection with the drawings.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their functional equivalents.

What is claimed is:

1. A flexible display device comprising:
    a flexible display panel comprising:
        a display substrate including:
            an active area; and
            a non-active area extending outside the active area and including a pad area and a bending area to be folded between the active area and the pad area;
        a thin film encapsulation layer on a first surface of the display substrate;
    a driving portion; and
    a function layer below a second surface opposite to the first surface of the display substrate,
    wherein the function layer includes a step portion having a first thickness and a second thickness greater than the first thickness, and
    wherein a curvature of the bending area corresponds to the first thickness of the function layer.

2. The flexible display device of claim 1, wherein the function layer comprises:
    a first surface facing the flexible display panel;
    a second surface opposite to the first surface; and
    a side surface connecting the first surface and the second surface,
    wherein a thickness of the step portion corresponds to the first thickness that is less than the second thickness of the functional layer in a direction from the second surface to the first surface of the functional layer.

3. The flexible display device of claim 2, wherein a pad terminal on the flexible display panel is connected to a driving terminal on the driving portion below the step portion.

4. The flexible display device of claim 3, wherein a portion at which the flexible display panel is connected to the driving portion does not extend beyond the second surface of the function layer.

5. The flexible display device of claim 3, wherein the driving portion comprises:
    a flexible film; and
    a driving integrated circuit (IC) located on the flexible film,
    wherein the driving terminal is located at an edge of the flexible film and corresponds to the pad terminal.

6. The flexible display device of claim 3, wherein a portion of the flexible display panel passes by the side surface of the function layer.

7. The flexible display device of claim 6, wherein the function layer comprises an extension portion extending from the side surface of the function layer, and contacting an inner surface of the flexible display panel at the bending area.

8. The flexible display device of claim 7, wherein a curvature of an edge of the extension portion corresponds to a curvature of the flexible display panel at the bending area.

9. The flexible display device of claim 6, wherein a filling material fills a space between the flexible display panel at the bending area and the side surface of the function layer.

10. The flexible display device of claim 1, further comprising a support layer between the flexible display panel and the function layer.

11. The flexible display device of claim 10, wherein a Young's modulus of the support layer is 10 MPa or more, and
    wherein a thickness of the support layer is about 5 micrometers or less.

12. The flexible display device of claim 1, wherein the flexible display panel is bent away from the thin film encapsulation layer at the bending area.

* * * * *